US008957682B2

United States Patent
Greiser

(10) Patent No.: US 8,957,682 B2
(45) Date of Patent: Feb. 17, 2015

(54) METHOD AND MAGNETIC RESONANCE SYSTEM TO AUTOMATICALLY DETERMINE PARAMETERS OF A FLOW MEASUREMENT

(75) Inventor: Andreas Greiser, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 530 days.

(21) Appl. No.: 13/410,687

(22) Filed: Mar. 2, 2012

(65) Prior Publication Data
US 2012/0223713 A1 Sep. 6, 2012

(30) Foreign Application Priority Data

Mar. 4, 2011 (DE) .......................... 10 2011 005 100

(51) Int. Cl.
*G01V 3/00* (2006.01)
*G01R 33/563* (2006.01)
*G01R 33/565* (2006.01)

(52) U.S. Cl.
CPC ...... *G01R 33/56316* (2013.01); *G01R 33/5635* (2013.01); *G01R 33/56518* (2013.01)
USPC ........................................................ 324/312

(58) Field of Classification Search
CPC ............. G01R 33/243; G01R 33/5601; G01R 33/5611; G01R 33/5635; G01R 33/56316; G01R 33/56518
USPC ................................................. 324/300–322
See application file for complete search history.

(56) References Cited

U.S. PATENT DOCUMENTS

| 6,091,243 | A  | * | 7/2000  | Xiang et al.      | 324/307 |
| 6,703,835 | B2 | * | 3/2004  | Patch et al.      | 324/307 |
| 6,771,067 | B2 | * | 8/2004  | Kellman et al.    | 324/307 |
| 6,957,097 | B2 | * | 10/2005 | Park et al.       | 600/419 |
| 7,515,742 | B2 | * | 4/2009  | Zhao et al.       | 382/128 |
| 7,545,141 | B2 | * | 6/2009  | Kimura            | 324/306 |
| 7,847,545 | B2 | * | 12/2010 | Wiesinger et al.  | 324/306 |

(Continued)

OTHER PUBLICATIONS

"Fully-Automated Volumetric MRI With Normative Ranges: Translation to Clinincal Practice," Brewer, Behavioural Neurology, vol. 21 (2009) pp. 21-28.

(Continued)

*Primary Examiner* — Dixomara Vargas
(74) *Attorney, Agent, or Firm* — Schiff Hardin LLP

(57) ABSTRACT

In a method and a magnetic resonance system to automatically determine parameters of a phase contrast flow measurement, a phase contrast pre-measurement with a flow coding sequence is implemented in a predetermined volume segment of an examination subject, and the flow coding sequence is varied in terms of its parameters so that a pre-measurement is respectively implemented for multiple different parameter sets of the flow coding sequence. A model is automatically determined with which a dimension of a phase error can be determined for each parameter set in the flow measurement, in that phase values of the pre-measurement which is implemented with the flow coding sequence with the respective parameter set are analyzed. Those parameters of the flow measurement at which the dimension of the phase error is smallest are automatically determined.

14 Claims, 2 Drawing Sheets

(56) References Cited

U.S. PATENT DOCUMENTS

| | | | |
|---|---|---|---|
| 8,314,614 B2 * | 11/2012 | Eggers et al. | 324/307 |
| 8,710,840 B2 * | 4/2014 | Gross et al. | 324/309 |
| 8,781,197 B2 * | 7/2014 | Wang et al. | 382/131 |
| 2003/0193335 A1 * | 10/2003 | Patch et al. | 324/307 |
| 2003/0199750 A1 * | 10/2003 | Park et al. | 600/410 |
| 2004/0162483 A1 * | 8/2004 | Kimura | 600/419 |
| 2007/0038072 A1 | 2/2007 | Guhring et al. | |
| 2008/0038829 A1 | 2/2008 | Kremer et al. | |

OTHER PUBLICATIONS

"A Fully Automated Method for Quantitative Cerebral Hemodynamic Analysis Using DSC-MRI," Bjørnerud et al., Journal of Cerebral Blood Flow & Metabolism, vol. 30 (2010) pp. 1066-1078.

* cited by examiner

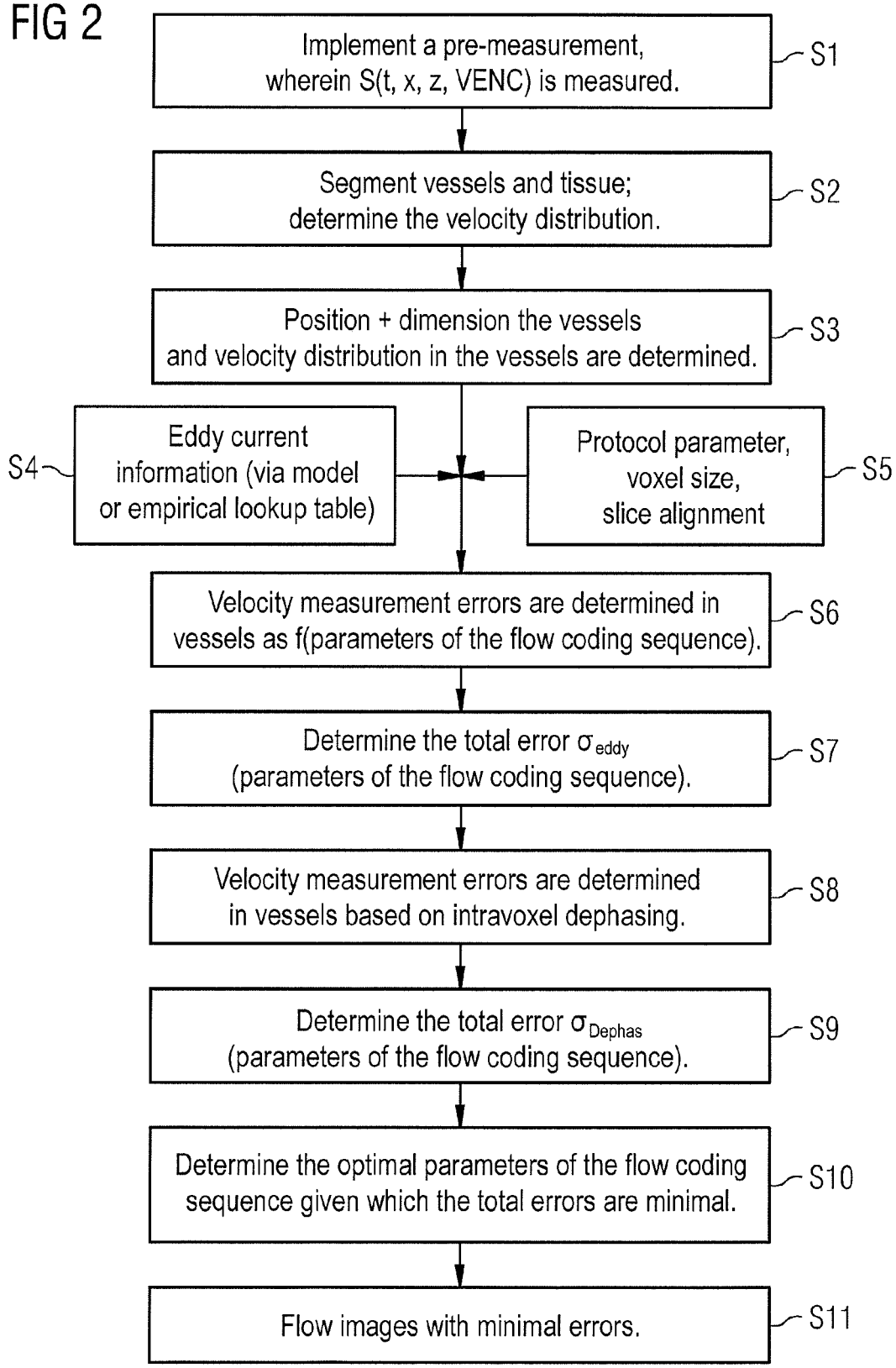

METHOD AND MAGNETIC RESONANCE SYSTEM TO AUTOMATICALLY DETERMINE PARAMETERS OF A FLOW MEASUREMENT

BACKGROUND OF THE INVENTION

1. Field of the Invention

The present invention concerns a method in order to automatically determine parameters of a phase contrast flow measurement, and a correspondingly designed magnetic resonance (MR) system.

2. Description of the Prior Art

According to the prior art, significant errors in the measured flow values occur in MR phase contrast flow measurements. The two most important sources of errors are remaining eddy current effects and dephasing errors that lead to signal cancellations due to an intravoxel dephasing (due to the spin-spin interaction, for example), particularly at high flow velocities or large local velocity changes.

According to the prior art, the same flow protocol (i.e. the same parameter set) is used for all applications or situations. Depending on the slice guidance, pathology etc., more or less precise results are achieved for the measured flow values. In principle, it is also conceivable to create and store different protocols for different applications or situations, wherein the user is prompted to select the correct protocol for the current situation.

SUMMARY OF THE INVENTION

An object of the present invention is to provide a protocol or a parameter set for a phase contrast flow measurement that when used, causes the phase error in the flow values that are measured with it to be as small as possible.

This object is achieved in accordance with the present invention by a method to automatically determine parameters of a phase contrast flow measurement by means of a magnetic resonance system. The method according to the invention thereby includes the following steps.

An MR phase contrast pre-measurement is implemented in a predetermined volume segment of an examination subject (in particular a person) with a flow coding sequence. The parameters of the flow coding sequence are varied so that a pre-measurement for various parameter sets of the flow coding sequence is respectively implemented. In other words, multiple pre-measurements are implemented in the predetermined volume segment. Each of these pre-measurements (or, more precisely, pre-flow measurements) operates with a different parameter set of the flow coding sequence.

A model is created automatically from the results of the pre-measurement, with which a dimension (extent) of a phase error can be determined for each parameter set in the flow measurement that is to be implemented subsequently, by phase values of the respective pre-measurement being analyzed depending on the respective set parameter. After this, for each pre-measurement (and therefore for each parameter set of the flow coding sequence) the phase values determined with this parameter are analyzed in order to adapt a model via this analysis, with which model the extent of the phase error (which in particular comprises eddy current errors and/or dephasing errors) can be determined for every conceivable parameter set. The model can also be a collection of additional parameter sets with the respective dimension of the eddy current error that have been measured previously (before the method according to the invention) for the same magnetic resonance system.

Those parameters of the flow measurement that is still to be implemented at which the dimension of the phase error is smallest are determined automatically. These parameters at which the dimension of the phase error is smallest thereby do not normally coincide with the parameters for which a pre-measurement was implemented.

By the analysis of the phase values of the individual pre-measurements depending on the respective parameter set used for this, the dimension of the phase error can be determined via the model, even in other parameter sets, even if no explicit pre-measurement was implemented for such a parameter set. It is thereby possible to determine that parameter set (those parameters) of the flow coding sequence at which the results affected least by phase errors are achieved in a phase contrast flow measurement.

Through the present invention, requirements with regard to a minimization of the phase error that appear to be in opposite with one another are brought into line in the optimization of the measurement sequence (flow coding sequence). While the gradient strengths and rise times that are used should turn out to be as small as possible to reduce the eddy currents, which leads to an extension of the measurement sequence (in particular of the echo time TE), the echo time TE would have to be minimized to reduce the intravoxel dephasing. Because according to the invention the optimal parameter set is created such that the dimension of the phase error (which in particular results both from the eddy current effects and the intravoxel dephasing) is as small as possible given this parameter set, both error types are optimally taken into account.

In order to determine the dimension of the eddy current effects, velocity values in a tissue region of the predetermined volume segment can be determined for the respective pre-measurement. Since no velocity is present in a tissue region (meaning that the actual velocity amounts to 0 m/s), a deviation from this actual velocity indicates a dimension for the eddy current error for each parameter set.

These deviations, together with the respective parameter set at which these deviations have been measured, can be used as what are known as node points for the adaptation of a present eddy current error model. Effects of the eddy current effects can subsequently be determined with this eddy current model adapted in such a manner, even in other regions of the predetermined volume segment for which no data were acquired in the pre-measurement. The dimensions of the eddy current error therefore can also be determined in a vessel (in which a flow is present, thus in which a velocity≠0 m/s would be measured) of the volume segment with the adapted eddy current error model for any other parameter sets.

However, according to the invention it is also possible that the respective dimension of the eddy current error is known in advance for additional parameters sets, for example from previously implemented measurements. The previously known parameter sets, together with the corresponding dimension of the eddy current error, can then be conformed to the parameter sets measured in the pre-measurements, together with the dimension of the eddy current error that was measured. The dimension of the eddy current error can then also be determined in other regions, and for other parameter sets, with the use of the conformed parameter sets. The dimensions of the eddy current error thus can also be determined in an arbitrary vessel of the volume segment for any other parameter sets.

The dephasing error can be determined using velocity variations or velocity changes. The velocity change for the respective parameter set can be determined from a change of the velocity detected with this parameter set, depending on the position (dV/ds) (V corresponds to the velocity; s corresponds to the location), thus via a derivation of the velocity over the position. However, it is also possible to determine the velocity change from a variation of the measured velocity depending on the respective flow coding for the same position (dV/dVENC), (VENC corresponds to the flow coding), thus by a derivative of the velocity over the flow coding.

This procedure is therefore based on the fact that an intra-voxel dephasing error is present when significantly different velocity components (in different directions, for example) occur within a voxel (image point), which different velocity components add vectorially to a smaller value than if all components point in the same direction. Vessel measurements can thereby also at least indirectly play a role since, given a maintained resolution of the measurement, the velocity contributions in a voxel normally vary more severely in smaller vessels than given comparably larger vessels.

Additional velocity measurement values (and therefore velocity variations) can be known in advance for additional parameter sets, for example from corresponding measurements at a phantom. These additional parameter sets, together with the respectively determined velocity values, can be conformed to the parameter sets measured in the pre-measurements and the measured velocity measurement values. Dephasing errors can be determined with the aid of these adapted additional parameter sets and the associated velocity measurement values, even in arbitrary regions of the predetermined volume segment. The dephasing errors can thereby also be determined in a vessel of the volume segment for arbitrary parameter sets.

With the embodiments depicted in the preceding it is possible to determine vessels within the predetermined volume segment, and then to determine a first total error with regard to the eddy current effects and a second total error with regard to the intravoxel dephasing within these vessels for an arbitrary parameter set. If the dimension of the error is calculated as a sum of the first total error and the second total error, that parameter set can be determined at which the dimension of the phase error or this sum is smallest.

In a further embodiment according to the invention, the parameters of the flow coding sequence for which the dimension of the phase error is smallest are determined by extrapolating the dimension of the phase error (thus in particular of the eddy current error and the dephasing error) is extrapolated for arbitrary parameter sets, starting from the results determined during the pre-measurements. Both eddy current errors and dephasing errors for arbitrary parameter sets can be determined via the extrapolation of the results which were measured in the pre-measurements, which in turn enables that parameter set to be determined at which the effect of the sum of eddy current errors and dephasing errors is smallest.

A parameter set of the flow coding sequence thereby comprises parameters which originate from one of the following parameter groups:

Parameters of a flow coding gradient of the flow coding sequence, for example strength, duration and time interval of a bipolar gradient pulse.

Parameters of an RF excitation pulse of the flow coding sequence with which a slice or a three-dimensional volume of the predetermined volume segment is excited for the flow measurement.

A spatial resolution of measurement points, i.e. a spatial separation between adjacent measurement points at which flow measurement is conducted.

Slice guidance direction, i.e. that direction in which a normal vector points that is orthogonal to the measured slices.

Within the scope of the present invention, a magnetic resonance system is also provided for phase contrast flow measurement. The magnetic resonance system thereby comprises a basic field magnet; a gradient field system; an RF antenna; and a control device in order to control the gradient field system and the RF antenna, to receive measurement signals acquired by the RF antenna, to evaluate these measurement signals, and thus to implement a flow measurement. The magnetic resonance system is designed to implement a pre-measurement with a flow coding sequence within a predetermined volume segment of an examination subject. In this pre-measurement, the magnetic resonance system varies the parameters of the flow coding sequence so that multiple pre-measurements are implemented for a respective parameter set. The magnetic resonance system is configured to create or adapt a model in order to determine a dimension of a phase error in the phase contrast flow measurement for any arbitrary parameter set. For this purpose, the magnetic resonance system analyzes the pre-measurements and the parameter sets that are thereby used. Finally, the magnetic resonance system is configured to determine that parameter set (those parameters) given which the dimension of the phase error (in particular the eddy current error and the dephasing error) is smallest.

The advantages of the magnetic resonance system according to the invention essentially correspond to the advantages of the method according to the invention as described above.

The above object is also achieved in accordance with the present invention by a non-transitory, computer-readable data storage medium encoded with programming instructions that, when the storage medium is loaded into a computerized control and evaluation system of a magnetic resonance system, cause the control and evaluation system to operate the magnetic resonance system to execute any or all of the above-described embodiments The software (programming instructions) can be a source code (C++, for example) that must still be compiled (translated) and linked or that only must be interpreted, or it can be an executable software code that has only to be loaded into the corresponding computer for execution.

The electronically readable data medium can be a DVD, a magnetic tape or a USB stick, for example on which is stored electronically readable control information, in particular software (see above).

The present invention enables the configuration of an individual protocol to be measured on the basis of a pre-measurement integrated into the measurement workflow, which pre-measurement has previously only been implemented to determine the optimal flow coding ("VENC scout"). Vessel segments of interest can be associated via corresponding markers or via the acquisition of what are known as landmarks. Via the present invention, the information acquired in a pre-measurement can be used for an automatic optimization of the flow coding (VENC ("Velocity ENCoding value")), for an automatic classification of the tissue regions in stationary regions, noisy regions, and vessel regions, and for an automatic optimization of the parameters of a phase contrast flow measurement (in particular of the flow coding gradients).

The present invention is in particular suitable for MR angiography. Naturally, the present invention is not limited to this preferred field of application since the present invention can also be used to determine flow velocities without vessel imaging, for example.

BRIEF DESCRIPTION OF THE DRAWINGS

FIG. 2 is a flowchart for an exemplary embodiment of the method according to the invention.

DESCRIPTION OF THE PREFERRED EMBODIMENTS

Figure 1:
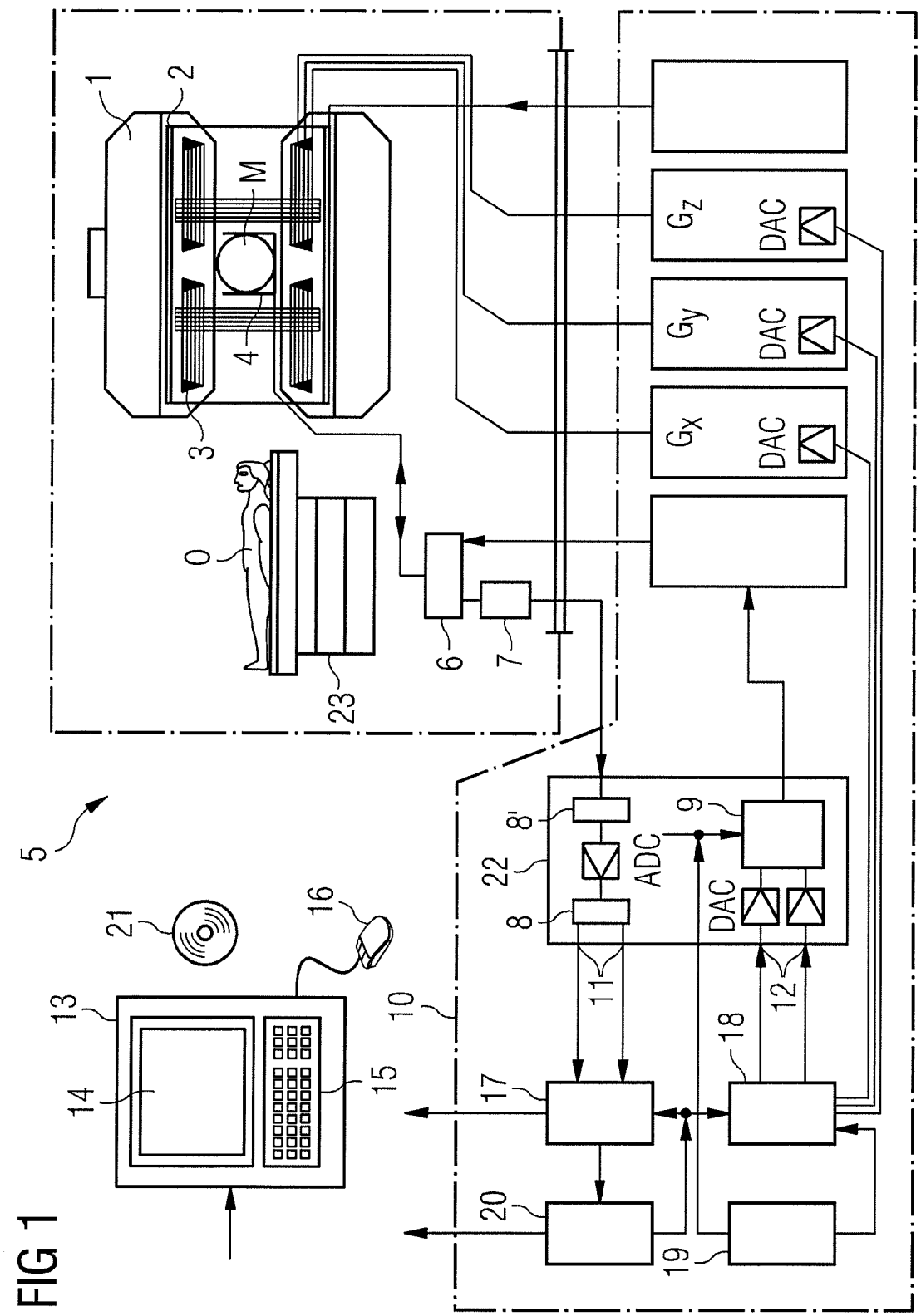
FIG. 1 schematically illustrates a magnetic resonance system according to the invention.

FIG. 1 is a schematic representation of a magnetic resonance system 5 (a magnetic resonance imaging or magnetic resonance tomography apparatus). A basic field magnet 1 generates a temporally constant, strong magnetic field for polarization or alignment of the nuclear spins in an examination region of a subject O—for example a part of a human body—that is to be examined. The subject O, lying on a table 23, is moved into the magnetic resonance system 5 for data acquisition. The high homogeneity of the basic magnetic field that is required for the magnetic resonance measurement is defined in a typically spherical measurement volume M. What are known as shim plates made of ferromagnetic material are mounted at a suitable point to assist the homogeneity requirements, and in particular to elimination temporally invariable influences. Temporally variable influences are eliminated by shim coils 2.

A cylindrical gradient coil system 3 composed of three sub-windings is used in the basic field magnet 1. Each sub-winding is supplied with current by an amplifier to generate a linear (and temporally variable) gradient field in a respective direction of a Cartesian coordinate system. The first sub-winding of the gradient field system 3 generates a gradient $G_x$ in the x-direction; the second sub-winding generates a gradient $G_y$ in the y-direction; and the third sub-winding generates a gradient $G_z$ in the z-direction. The amplifier comprises a digital/analog converter which is activated by a sequence controller 18 for time-accurate generation of gradient pulses.

One (or more) radio-frequency antennas 4 that convert the radio-frequency pulses emitted by a radio-frequency power amplifier into an alternating magnetic field for excitation of the nuclei and alignment of the nuclear spins of the subject O to be examined or of the region of the subject O that is to be examined are located within the gradient field system 3. Each radio-frequency antenna 4 has of one or more RF transmission coils and one or more RF reception coils in the form of an annular, advantageously linear or matrix-like arrangement of component coils. The alternating field emanating from the precessing nuclear spins—i.e. normally the nuclear spin echo signals caused by a pulse sequence composed of one or more radio-frequency pulses and one or more gradient pulses—is also converted by the RF reception coils of the respective radio-frequency antenna 4 into a voltage (measurement signal) that is supplied via an amplifier 7 to a radio-frequency reception channel 8 of a radio-frequency system 22. The radio-frequency system 22 furthermore has a transmission channel 9 in which the radio-frequency pulses are generated for the excitation of the nuclear magnetic resonance. The respective radio-frequency pulses are digitally represented in the sequence controller 18 as a series of complex numbers based on a pulse sequence predetermined by the system computer 20. This number sequence is supplied as a real part and imaginary part to a digital/analog converter in the radio-frequency system 22 via respective inputs 12 and from the digital/analog converter to a transmission channel 9. In the transmission channel 9, the pulse sequences are modulated on a radio-frequency carrier signal whose base frequency corresponds to the resonance frequency of the nuclear spins in the measurement volume.

The switching from transmission operation to reception operation takes place via a transmission/reception diplexer 6. The RF transmission coils of the radio-frequency antenna(s) 4 radiate(s) the radio-frequency pulses for excitation of the nuclear spins into the measurement volume M and scans resulting echo signals via the RF reception coil(s). The correspondingly acquired nuclear magnetic resonance signals are phase-sensitively demodulated at an intermediate frequency in a first demodulator 8' in the reception channel (first demodulator) of the radio-frequency system 22 and digitized in an analog/digital converter (ADC). This signal is further demodulated at a frequency of 0. The demodulation at a frequency of 0 and the separation into real part and imaginary part occurs in a second demodulator 8 after the digitization in the digital domain. An MR image is reconstructed by the image computer 17 from the measurement data acquired in such a manner. The administration of the measurement data, the image data and the control programs takes place via the system computer 20. Based on a specification with control programs, the sequence controller 18 monitors the generation of the respective desired pulse sequences and the corresponding scanning of k-space. In particular, the sequence controller 18 controls the time-accurate switching of the gradients, the emission of the radio-frequency pulses with defined phase amplitude and the reception of the magnetic resonance signals. The time base for the radio-frequency system 22 and the sequence controller 18 is provided by a synthesizer 19. The selection of corresponding control programs to generate an MR image (which control programs are stored on a DVD 21, for example) and the presentation of the generated MR image take place via a terminal 13 which comprises a keyboard 15, a mouse 16 and a monitor 14.

A flowchart of an embodiment of the method according to the invention is shown in FIG. 2.

In a first Step S1, a pre-measurement is implemented in which data or phase values S (and therefore flow velocity values) are measured depending on the time t, on the position x, y and on a flow coding (VENC).

In a second Step S2, an automatic segmentation is implemented in order to detect vessels and static tissue within the predetermined volume segment. Moreover, in this step 52 a velocity analysis of the velocity values determined in the previous Step S1 occurs in order to determine a velocity distribution in particular.

In the following Step S3, the precise position and the dimensions (the diameter, for example) of the vessels are determined. A velocity distribution within the vessels is determined based on this information.

Eddy current information is supplied in the method according to the invention via Step S3. This eddy current information is for the most part an eddy current model which is adapted to the current situation or current conditions in the following method via the results of the pre-measurement. The model of the eddy current information can also be provided in the form of empirically determined data which are stored in a lookup table, wherein the empirically determined data are likewise adapted to the current conditions via the results of the pre-measurement. With this eddy current information adapted to the current conditions, an error due to eddy current effects can be determined for arbitrary parameter sets at an arbitrary point within the predetermined volume segment to be examined.

The protocol parameters (the parameters of the flow coding gradient or of the RF excitation pulse that were used in the pre-measurement), a voxel size (i.e. a spatial resolution of the measurement points) and a slice orientation (i.e. a direction in which the predetermined volume segment is scanned slice by slice) are provided to the method according to the invention via Step S5.

Based on the eddy current information, a velocity measurement error can now be determined in Step S6 within arbitrary vessels, and therefore also in defined vessels. This velocity measurement error is thereby dependent on the parameters of the flow coding sequence. In other words: in Step S6 the velocity measurement error can be determined at arbitrary points within arbitrary vessels for any arbitrary parameter set of the flow coding sequence.

Therefore, in the following Step S7 it is possible to determine the total error $\sigma_{eddy}$ (which results due to the eddy current effects) for any arbitrary parameter set of the flow coding sequence, for example by integrating the velocity measurement error across a vessel.

In Step S8, velocity measurement errors due to the intravoxel dephasing are similarly determined at arbitrary points in arbitrary vessels depending on an arbitrary parameter set of the flow coding sequence. In the following Step S9, for any arbitrary parameter set of the flow coding sequence the total error which results due to the dephasing effects can thereby be determined depending on an arbitrary parameter set of the flow coding sequence.

In Step S10, those optimal parameters or that optimal parameter set of the flow coding sequence are/is determined given which the sum of the total error $\sigma_{eddy}$ due to the eddy current effects and the total error a $\sigma_{Dephas}$ due to the dephasing effects is minimal.

In Step S11, flow images (i.e. MR images with flow information) are then created with this parameter set, wherein the phase errors due to eddy current effects and the dephasing effects are minimal.

By means of the present invention, the pre-measurement which—according to the prior art—is used only for optimization of the flow sensitivity is used to determine additional measurement parameters of the actual primary measurement for flow quantification. In particular, background phase effects due to eddy current effects can thereby be determined from the signal curve in stationary tissue. The different flow coding gradients can thereby be varied with regard to their properties or parameters such that the dimension of the eddy current effects can be derived—even in the vessel region of interest—so that optimal parameters for the primary measurement can be determined so that the measurement results of said primary measurements have acceptable contributions due to eddy current effects.

In the analysis of the results of the pre-measurements, conclusions about the dimension of the intravoxel dephasing can be drawn in particular via the respectively determined maximum velocity (which normally is independent relative to slight changes of the parameter set) or via the signal variation for the various VENCs (flow sensitivity set per pre-measurement). It is thereby possible to optimize the measurement parameters such that a best possible overall precision can be achieved in which both eddy current effects and dephasing errors are taken into account.

In other words, according to the invention an algorithm can be formulated which yields the optimal parameters for the actual measurement for flow quantification from the measurement results (S(t, x, y, VENC), i.e. a four-dimensional data field of the pre-measurements) with knowledge of the sequence properties.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method to automatically determine parameters of a phase contrast flow measurement in a magnetic resonance system, comprising:
    operating a magnetic resonance data acquisition unit to acquire flow measurement magnetic resonance data from a subject, said magnetic resonance flow measurement data comprising phase values that are subject to phase error, by implementing a phase contrast pre-measurement with a flow coding sequence in a predetermined volume segment of the examination subject, said flow coding sequence being defined by a plurality of sequence parameters, and varying said sequence parameters of said flow coding sequence to implement said pre-measurement respectively for multiple different parameter sets of the flow coding sequence;
    in a processor, automatically analyzing said phase values in the flow measurement magnetic resonance data acquired for each parameter set to determine a model with which a dimension of a phase error that resulted from the respective parameter set can be determined; and
    in said processor, automatically determining, from said model, a parameter set for a phase contrast flow measurement for which said dimension of said phase error is smallest, and making said parameter set for which said phase error is smallest available in electronic form at an output of said processor.

2. A method as claimed in claim 1 comprising generating said model wherein said phase error is selected from the group consisting of an eddy current error and a dephasing error.

3. A method as claimed in claim 1 comprising producing said model with an eddy current error as said phase error, and, in said processor, determining a deviation from 0 cm/s with respect to said pre-measurement in a tissue region within said predetermined volume segment for each parameter set, and determining the dimension of the eddy current error dependent on said deviation determined for each parameter set.

4. A method as claimed in claim 3 comprising, in said processor, and determining node points for adapting a predetermined eddy current error model, using said deviation for each parameter set, and determining the dimension of the eddy current error in at least one vessel in said volume segment for any other parameter sets using the adapted predetermined eddy current error model.

5. A method as claimed in claim 3 comprising providing said processor with a dimension of said eddy current error known from additional parameter sets and conforming said additional parameter sets together with the respective dimension of the eddy current error thereof, to said parameter set measured in the pre-measurement together with the corresponding dimension of the eddy current error, and determining the dimension of the eddy current error in at least vessel of the volume segment for any other parameter sets using the conformed additional parameter sets and the corresponding dimension of the eddy current error.

6. A method as claimed in claim 1 comprising producing said model with a dephasing error as said phase error, and determining a velocity variation for each parameter set in said pre-measurement and determining the dimension of the dephasing error dependent on said velocity variation in the respective parameter sets.

7. A method as claimed in claim 6 comprising providing said processor with additional velocity variations known for additional parameter sets measured using a phantom, conforming the additional parameter sets, together with the corresponding velocity variation thereof, to the parameter sets measured in the pre-measurement, together with the corresponding velocity variation thereof, and determining dephasing errors in at least one vessel of said volume segment for any other parameter sets using the conformed additional parameter sets together with the corresponding velocity variations.

8. A method as claimed in claim 6 comprising determining said velocity variation as a variation of measured velocity with respect to position.

9. A method as claimed in claim 6 comprising determining said velocity variation for the respective parameter sets from a variation of measured velocity dependent on flow coding for defined position in the volume segment.

10. A method as claimed in claim 1 comprising producing said model with an eddy current error and a dephasing error as said phase error, and determining vessels within said predetermined volume segment and generating a first total error with respect to the eddy current error within said vessels and determining a second total error with respect to the dephasing error within said vessels, from said model, and determining the dimension of the phase error as a sum of said first total error and said second total error.

11. A method as claimed in claim 1 comprising determining the sequence parameters of the flow coding sequence for which the dimension of the phase error is smallest by extrapolating the dimension of the phase error for each parameter set, dependent on results of the determination of the phase error for each parameter set for which said flow measurement was implemented.

12. A method as claimed in claim 1 comprising selecting said plurality of sequence parameters from the group consisting of parameters of a flow coding gradient of said flow coding sequence, parameters of an RF excitation pulse of said flow coding sequence with which at least one slice of said predetermined volume segment is excited for the flow measurement, and a spatial resolution of measurement points for which said flow measurement is implemented.

13. A magnetic resonance system comprising:
a magnetic resonance data acquisition unit;
a control unit configured to operate a magnetic resonance data acquisition unit to acquire flow measurement magnetic resonance data from a subject, said magnetic resonance flow measurement data comprising phase values that are subject to phase error, by implementing a phase contrast pre-measurement with a flow coding sequence in a predetermined volume segment of the examination subject, said flow coding sequence being defined by a plurality of sequence parameters, and varying said sequence parameters of said flow coding sequence to implement said pre-measurement respectively for multiple different parameter sets of the flow coding sequence;
a processor configured to automatically analyze said phase values in the flow measurement magnetic resonance data acquired for each parameter set to determine a model with which a dimension of a phase error that resulted from the respective parameter set can be determined; and
said processor being configured to automatically determine, from said model, a parameter set for a phase contrast flow measurement for which said dimension of said phase error is smallest, and to make said parameter set for which said phase error is smallest available in electronic form at an output of said processor.

14. A non-transitory, computer-readable data storage medium encoded with programming instructions, said storage medium being loaded into a computerized control and evaluation system of a magnetic resonance system that also comprises a magnetic resonance data acquisition unit, said programming instructions causing said control and evaluation system to operate said magnetic resonance system to:
operate a magnetic resonance data acquisition unit to acquire flow measurement magnetic resonance data from a subject, said magnetic resonance flow measurement data comprising phase values that are subject to phase error, by implementing a phase contrast pre-measurement with a flow coding sequence in a predetermined volume segment of the examination subject, said flow coding sequence being defined by a plurality of sequence parameters, and varying said sequence parameters of said flow coding sequence to implement said pre-measurement respectively for multiple different parameter sets of the flow coding sequence;
automatically analyze said phase values in the flow measurement magnetic resonance data acquired for each parameter set to determine a model with which a dimension of a phase error that resulted from the respective parameter set can be determined; and
automatically determine, from said model, a parameter set for a phase contrast flow measurement for which said dimension of said phase error is smallest, and make said parameter set for which said phase error is smallest available in electronic form at an output of said control and evaluation system.

\* \* \* \* \*